US011342739B2

(12) United States Patent
Ossa Montoya et al.

(10) Patent No.: US 11,342,739 B2
(45) Date of Patent: May 24, 2022

(54) MONITORING AND PROTECTION DEVICE OF POWER DISTRIBUTION TRANSFORMERS ON THE LOW VOLTAGE SIDE

(71) Applicant: ATP TRADING S.A.S., Antioquia (CO)

(72) Inventors: Alexander Ossa Montoya, Antioquia (CO); John Jairo Zapata García, Antioquia (CO)

(73) Assignee: ATP TRADING S.A.S., Antioquia (CO)

( * ) Notice: Subject to any disclaimer, the term of this patent is extended or adjusted under 35 U.S.C. 154(b) by 0 days.

(21) Appl. No.: 16/964,774

(22) PCT Filed: Jan. 15, 2019

(86) PCT No.: PCT/IB2019/050314
§ 371 (c)(1),
(2) Date: Jul. 24, 2020

(87) PCT Pub. No.: WO2019/145825
PCT Pub. Date: Aug. 1, 2019

(65) Prior Publication Data
US 2021/0057903 A1  Feb. 25, 2021

(30) Foreign Application Priority Data
Jan. 24, 2018   (CO) .................. NC2018/0000647

(51) Int. Cl.
*H02H 7/04*   (2006.01)
*H02H 3/04*   (2006.01)
(Continued)

(52) U.S. Cl.
CPC ............... *H02H 7/04* (2013.01); *G01R 31/62* (2020.01); *H02H 1/0061* (2013.01); *H02H 3/04* (2013.01); *H02H 3/085* (2013.01)

(58) Field of Classification Search
CPC .... G01R 31/08; G01R 31/085; G01R 31/086; G01R 31/62; H02H 7/04–055
See application file for complete search history.

(56) References Cited

U.S. PATENT DOCUMENTS 5,117,325 A    5/1992  Dunk et al.
5,644,463 A *  7/1997  El-Sharkawi ............ H01H 9/56
                                                       361/2
(Continued)

FOREIGN PATENT DOCUMENTS

BR    PI1106022 A2   8/2015
CN    201854090 U    6/2011
(Continued)

OTHER PUBLICATIONS

International Search Report and Written Opinion for related PCT App No. PCT/IB2019/050314 dated May 24, 2019, 7 pgs.
(Continued)

*Primary Examiner* — Jared Fureman
*Assistant Examiner* — Christopher J Clark
(74) *Attorney, Agent, or Firm* — Procopio, Cory, Hargreaves & Savitch LLP

(57) ABSTRACT

The invention is related to a monitoring and protection device of power distribution transformers on the low voltage side. Said device monitors in a permanent manner the functioning of the transformer and provides a record of all the information in case of a fault. Additionally, the invention device provides the protection of the transformer in case of a fault, allowing a partial impact on the service and preventing peak currents that may reduce the useful life of the
(Continued)

transformer. The device has a remote communication module that allows the transmission of the recorded data, a control module that may be activated remotely and a visual alert module that reduces the risk in the handling of the device.

7 Claims, 2 Drawing Sheets

(51) Int. Cl.
*H02H 3/08* (2006.01)
*G01R 31/62* (2020.01)
*H02H 1/00* (2006.01)

(56) References Cited

U.S. PATENT DOCUMENTS

| | | |
|---|---|---|
| 6,453,248 B1 | 9/2002 | Hart et al. |
| 7,069,116 B2 | 6/2006 | Kunsman et al. |
| 7,720,619 B2 | 5/2010 | Hou |
| 9,136,692 B2 | 9/2015 | O'Regan et al. |
| 2006/0187600 A1* | 8/2006 | Brown ............... H02J 3/14 361/71 |
| 2012/0236442 A1* | 9/2012 | Satyanarayana ......... G05F 1/70 361/35 |
| 2014/0204494 A1* | 7/2014 | Miller ............... H02H 3/08 361/102 |
| 2018/0143237 A1* | 5/2018 | Beaudet ............... H04Q 9/02 |

FOREIGN PATENT DOCUMENTS

| | | |
|---|---|---|
| CN | 202363981 U | 8/2012 |
| WO | 2013169716 A1 | 11/2013 |

OTHER PUBLICATIONS

Tengdin, J., et al., High Impedance Fault Detection Technology, Report of PSRC Working Group D15, Mar. 1, 1996, 12 pgs.

Dorf, R.C., Systems, Controls, Embedded Systems, Energy, and Machines, The Electrical Engineering Handbook, Third Edition, 2006, 672 pgs.

* cited by examiner

MONITORING AND PROTECTION DEVICE OF POWER DISTRIBUTION TRANSFORMERS ON THE LOW VOLTAGE SIDE

CROSS-REFERENCE TO RELATED APPLICATIONS

This application is a U.S. National Stage entry of PCT Application No: PCT/IB2019/050314 filed Jan. 15, 2019, which claims priority to Colombia Patent Application No. NC2018/0000647 filed Jan. 24, 2018, the contents of which are incorporated herein by reference.

FIELD OF THE INVENTION

The invention is related to devices for being used within the electric distribution grid, particularly with devices for monitoring and protecting distribution transformers on the low voltage side.

BACKGROUND

The electrical power distribution grids have as function to carry the charge to final users in an efficient and secure manner, avoiding to the maximum the interruptions and anomalies in the service. Within the distribution grids, transformers are an essential element since they allow to reduce the tension transported by the grid to the level required by the final user. Said transformers are exposed to faults in the distribution circuit which reduces their useful life and leads to deficiencies in the service.

Those faults in distribution circuits not only cause problems in service quality by generating voltage reductions and interruptions but can also cause fires or threaten the lives of the people around the grid. Faults may be due to different factors, many of which are environmental such as lightnings, wind, contact of conductive with trees, among others, therefore their complete removal is not possible. In particular, high impedance faults are an important problem unresolved in distribution circuits (Dorf, R. Editor "Systems, Controls, Embedded systems, Energy and Machines", Taylor and Francis CRC press, Boca Raton, 2006).

In general, for transformers protection reclosers are used, which are switches that open and close the power line, avoiding that in case of an overload or short-circuit, a fuse blows out, leaving the line completely out of service. The state of the art discloses alternatives of the use of reclosers to this end, for example, the document U.S. Pat. No. 5,117,325 refers to an electronic control for a recloser, which stores a voltage in capacitors in response to the line current and compares it to a reference voltage to determine the line current level. If abnormally high levels of line current are found, the line is opened for a short period of time, the energy stored in the capacitors is supplied and after a period of time the recloser closes the circuit again.

This is how the protection of grid equipment is carried out in most of the cases, through relays or fuse circuit breakers, connected on the high-tension side, which completely interrupt the distribution circuit and require the intervention in the failure site for reestablishing the service.

In this regard, the document WO 2013/169716 refers to a device for interrupting the electricity flow in a distribution circuit which allows the protection of line laterals in temporary faults. This device has an electronic control that may be installed over the circuit breakers, new or existing in the power supply lines of high-tension and which allows the reconnection of the module when the fault is temporary, avoiding the need to intervention of an operator to reestablish the service.

On the other hand, the document CN 202363981 shows a comprehensive protection device of terminals of an intelligent electricity grid, which provides protection against overloads, short-circuits, overvoltage, low voltage, leakage and automated leak tracking. Besides, it has adjustment functions to a leakage value or overcurrent, as well as an automatic recloser of three times. Similarly, the module has a display, a function of data transmission, a fault alarm and a remote detection, communication and adjustment function. Said device comprises a flame-retardant casing, a main circuit, an auxiliary power supply circuit, a zero-sequence transformer, a voltage sampling circuit, a manganese-copper sampling circuit, a data comparison parameter and circuit adjustment, a single chip microcomputer, a LED display, an alarm circuit, a remote-control communication interface and automatic reconnection circuit.

Nevertheless, these protection systems usually act on the high-tension side and in case the fault is permanent, a total interruption of the service occurs. On the other hand, usually these systems are not effective to protect against high impedance faults.

High impedance faults occur when an energized conductive come into contact with an almost insulating object, such as a tree branch or a structural equipment, or when the conductive falls to the ground. Nevertheless, these faults do not produce a current alteration high enough to be detected in a reliable manner by conventional modules of overcurrent protection, which leads to long time faults that are harmful for grid equipment and may even constitute a latent public security risk (Tengdin, J. "High Impedance Fault Detection Technology" Report of PSRC Working Group D15, 1996).

In the case of transformers, when high impedance faults are not detected, they produce high currents during long periods of time, generating warmings that may harm the insulation of the transformer and subsequently lead to its total failure.

In the state of the art, there are different high impedance faults detection modules. The document U.S. Pat. No. 6,453,248 describes a high impedance faults detection system which comprises an analyzer located in a circuit breaker or substation. Said device analyzes the waveforms of the current and/or voltage for detecting a lack of high impedance in the supply or in a diversity of laterals connected to the supply. The system also includes a diversity of remote blackout detectors located at the corresponding place of clients, which include a mechanism for detecting power loss at the place and a computer in communication with the analyzer of the remote detectors.

On the other hand, the document U.S. Pat. No. 7,069,116 is related to a method, a module and an apparatus to detect high impedance faults in electrical distribution lines using a module which composed by a high impedance faults detection that is connected to one or more power conductive, a module based on charge curves and a module based on statistics. Additionally, said document discloses a protection relay for electrical distribution lines comprising one or more computing devices that allow detecting both high impedance faults and faults that do not imply high impedance.

On the other side, the document U.S. Pat. No. 7,720,619 discloses a method and an apparatus for detecting high impedance faults in multi-grounded electrical distribution modules. The apparatus described therein comprises a comparison filter, a trend meter with one output, an adaptive tuning algorithm, an infinite impulse response averaging and a decision logic to determine the existence of a high impedance fault, based on the output of the trend meter and a set of predetermined blocking conditions.

Likewise, the document U.S. Pat. No. 9,136,692 shows a module for the detection and insulation of high impedance faults of low current in electrical distribution lines that have an overcurrent protection mechanism and include a main supply line and a derivation coupled to said main supply line which has multiple distribution transformers and each one of them coupled to a client. Said module comprises a two-way communication network with a cell tower which receives and send RF signals; a diversity of smart meters that are coupled aside of the source or aside of the charge of a respective distribution transformer for monitoring the voltage along said transformer and that includes an additional smart meter which is in two-way communication with the other meters of said derivation; a server in communication with the cell tower for the processing and routing of RF signals of two-way communication; a host computer in communication with the server and a fault insulator arranged in the derivation between the main supply line and said distribution transformers, which is in communication with the host computer.

In this way, within the state of art there is no device specifically designed for monitoring transformers functioning in the distribution grid, on the low voltage side, and provide transformer protection against events such as overvoltage, for example those caused by atmospheric discharges, high impedance faults and other events as the absence of neutral. Therefore, in the state of the art there is a need for a device designed to monitor a transformer functioning, continuously recording the events and allowing a remote communication of said information and that at the same time provides protection, on the low voltage side of the transformer, against different fault types, such as overcurrents, overvoltages, high impedance faults and events of absence of neutral; which may be installed directly to the transformer on the low voltage side, without requiring intervention in other places of the grid and allowing it to be controlled in a remote way.

BRIEF DESCRIPTION OF THE INVENTION

The invention is related to a monitoring and protection device of power distribution transformers on the low voltage side. Said device monitors in a permanent manner the functioning of the transformer and provides a record of all the information in case of a fault (day, time, phase and circuit). Additionally, the invention device provides the protection of the transformer in case of a fault, allowing a partial impact on the service and preventing peak currents that may reduce the useful life of the transformer or overvoltages that may affect service quality.

Advantageously, the invention device is connected on the low voltage side, and in the event of a fault, insulates the charge allowing a partial impact on the service. Likewise, said invention device delays the entrance of the charge when the service is reestablished, avoiding peak currents and prolonging the useful life of the transformer.

The device also has a visual alert module that provides directions on its state and the possibility of its safe handling. Additionally, the device allows the automatic reconnection when the fault is temporary.

Advantageously, the device of the present invention allows the protection of distribution transformers without requiring the intervention in more than one place of the grid, providing information on the fault which allows to reduce the response time.

In this way, the monitoring and protection device of power distribution transformers on the low voltage side (1) which is subject of the present invention is characterized for comprising:

a power module (2) that is connected to the secondary busbar of the transformer and comprises a contactor or a relay;

a fault detection module (3) that comprises one or more overcurrent and voltage sensors;

a control module (4) that comprises a controller and two or more voltage comparators, a remote communication module (5);

an information recording module (6) and a visual alert module (7);

in which the control module (4) also comprises an algorithm that delays the entrance of the charge during the reconnection.

DETAILED DESCRIPTION OF THE INVENTION

Figure 1:
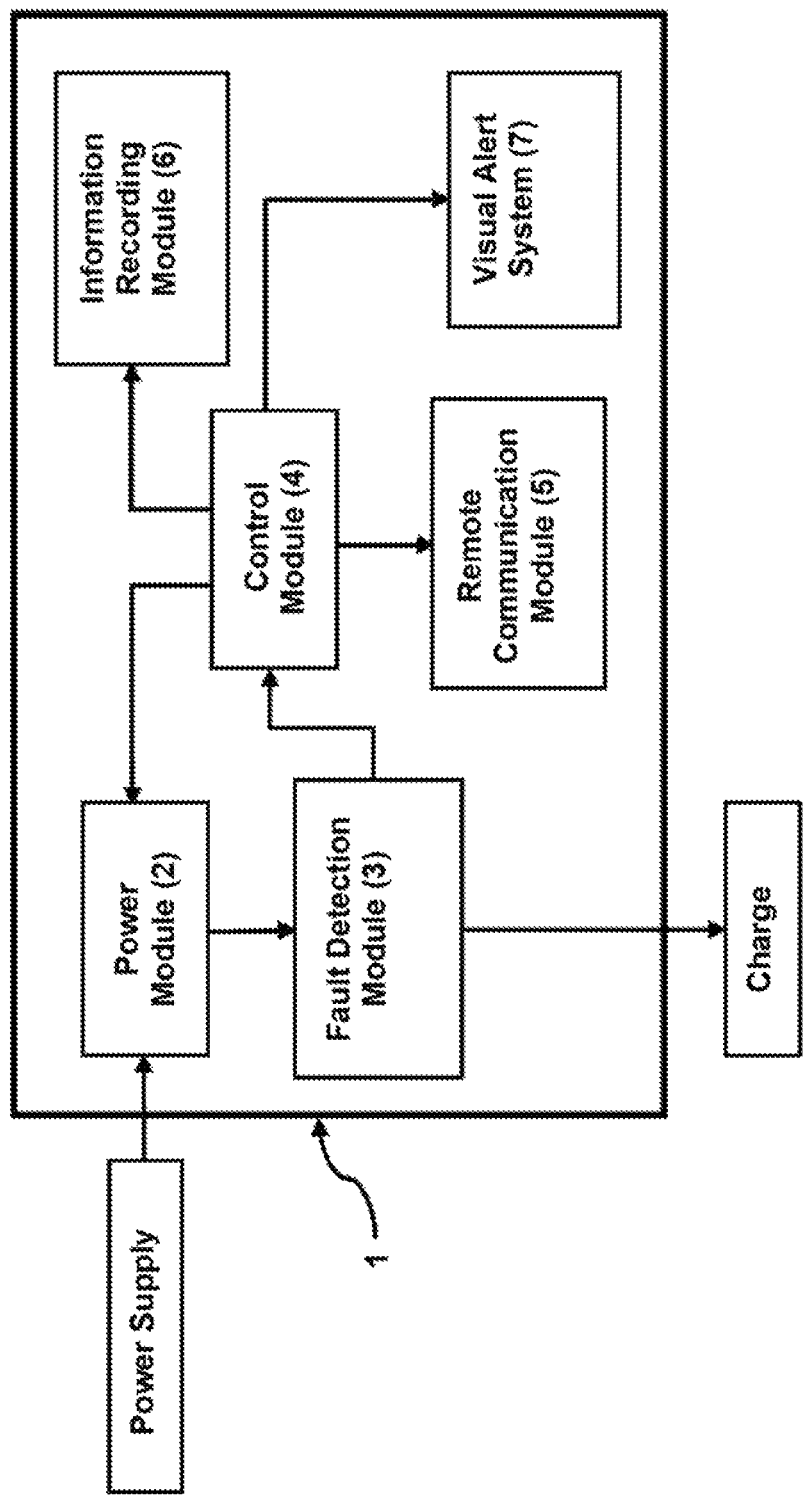
FIG. 1 shows a general scheme of the main components of the transformer protection device according to the present invention.

As shown in FIG. 1, the protection device of power distribution transformers on the low voltage side (1) according to the present invention, essentially comprises a power module (2); a fault detection module (3); a control module (4); a remote communication module (5); an information recording module (6) and a visual alert module (7).

Figure 2:
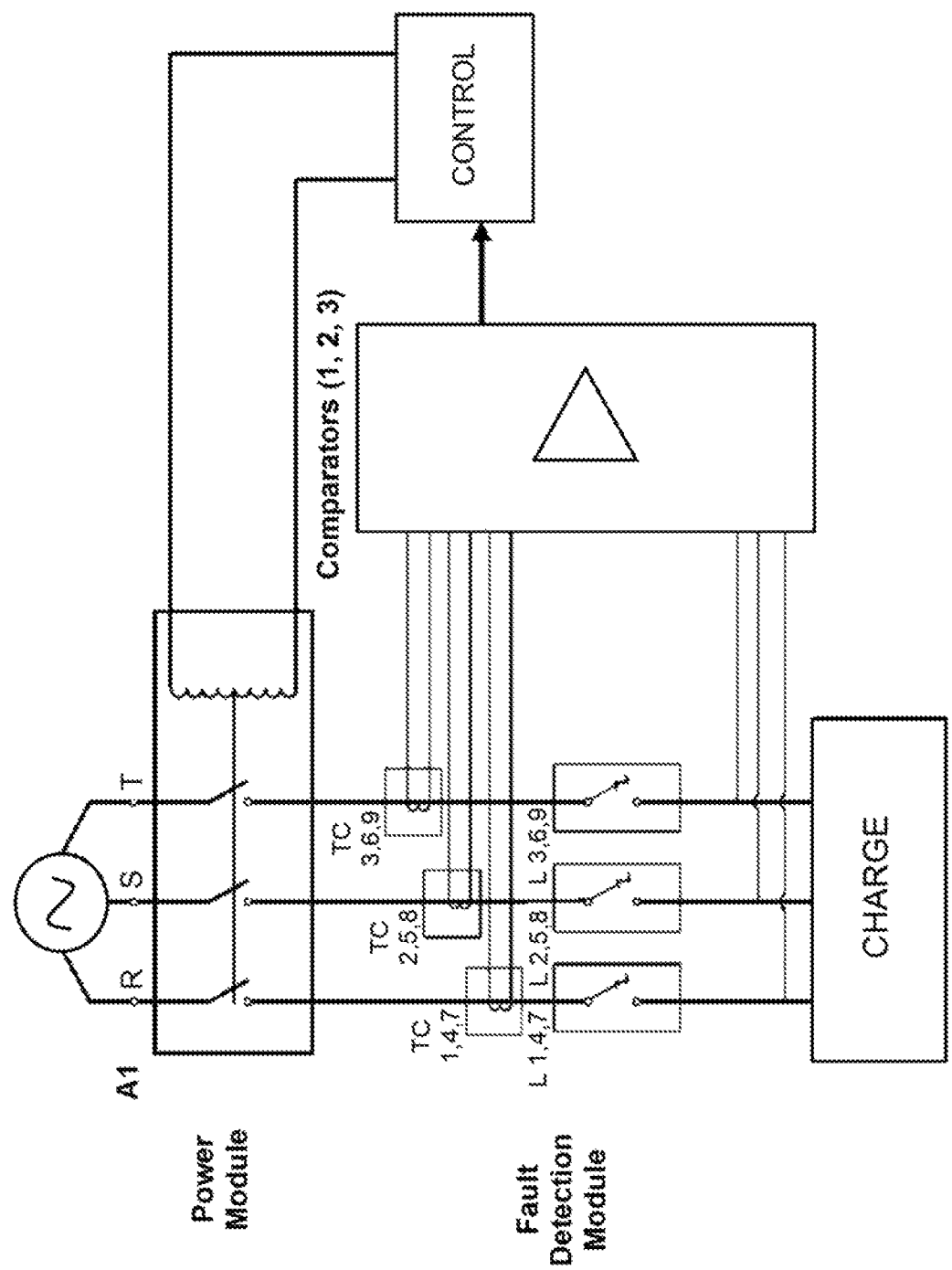
FIG. 2 corresponds to the electrical diagram of a preferred execution of the protection device of the present invention.

FIG. 2 shows the electrical diagram of a preferred execution of the invention. According to the present invention, the power module (2) is connected to the secondary busbar of the transformer and is controlled by the control module (4). Said power module (2) comprises a load-disconnector system that allows to insulate the load without having to de-energize the transformer.

In a preferred execution of the invention, without limiting the scope of the present invention, the load-disconnector module of the power module (2) corresponds to a contactor (A1). In a preferred manner, without limiting the scope of the requested protection, the contactor (A1) has a multi-voltage tripping coil. In an even more preferred execution, the tripping coil of the contactor (A1) operates between 75V and 300 V, more preferably between 85V and 285 V. Said multi-voltage tripping coil allows that a voltage fluctuation in the line does not affects the coil and, hence, no noise is inserted into the charge.

Then, in the direction of the current, from said power module (2) the fault detection module (3) is connected, as shown in FIGS. 1 and 2. As is shown in FIG. 2, said fault detection module (3) of the protection device (1) which is subject of the present invention comprises at least one overcurrent sensor and at least a voltage sensor. In a more preferred execution of the invention, without limiting the scope thereof, said fault detection module (3) comprises a diversity of overcurrent sensors, for example and without this limiting the scope of the present invention, one for each phase. Any overcurrent sensor known in the state of the art can be used without this limiting the scope of the requested protection. For example, and without this limiting the scope of the present invention, said overcurrent sensor may correspond to a current limiter, as shown in FIG. 2 with references L1-L9 or to a current transformer. In another more preferred execution of the invention, without this limiting the scope thereof, said fault detection module (3) comprises a diversity of voltage sensors, for example and without this limiting the scope of the present invention, one for each phase. In another preferred execution of the invention, without this limiting the scope thereof, the fault detection module (3) may comprise current transformers and/or bimetallic thermal fuses connected in series with the charge and calibrated to a given current and/or window-type current transformers and voltage detectors.

Additionally, said fault detection module (3) is configured to communicate the measurements obtained with said overcurrent sensor and said voltage sensor to the control module (4) which may determine, based on the signals detected in the fault detection module (3), if some fault has occurred on the low voltage side of the transformer that is to be protected.

On the other side, according to the present invention, the control module (4) comprises a controller, a current comparator (Comparator 1 in FIG. 2) and two or more voltage comparators (Comparators 2 and 3 in FIG. 2). Said comparators generate respective output signals that may be acquired by the controller of said control module (4). In a preferred execution of the invention, without this limiting the scope of the requested protection, the control module (4) is located over a digital card and comprises a processor able to execute an algorithm which delays the entry of the charge during the reconnection. This delay time may be selected through two switches that are on the digital card of the device and prevents that charges from different circuits receive power at the same time, which produce overcurrents that in the long run results in a reduction of the useful life of the transformer.

In a preferred execution of the invention, the delay time is chosen randomly and can be between 0 to 10 seconds, 10 to 20 seconds, or 20 to 30 seconds without this limiting the scope of the present invention. Due to this delay, the charge input is made in an ascending ramp which facilitates the entrance and protects the transformer of sudden charges that affect its useful life.

On the other side, the protection device (1) which is subject of the present invention includes a remote communication module (5) that is configured for a bidirectional communication with said control module (4), in order to the protection device (1) which is subject of the present invention may be put into operation or disconnected without needing the manual handling thereof, thus avoiding that a worker has to climb to the distribution pole in which the transformer is placed. Additionally, the configuration of the bidirectional communication allows to communicate information from said control module (4) to a plant or a remote device. Even though the specific manner in which said remote communication module (5) is implemented does not limit the scope of the present invention, in a preferred execution said remote communication module (5) may comprise a radio frequency transceiver that can be configured for the communication through Bluetooth, GPRS, IoT, communication by radio or other wireless communication protocols, both long range and short range.

On the other hand, as previously mentioned, the protection device (1) which is subject of the present invention comprises an information recording module (6). Said information recording module (6) comprises a non-volatile memory that can be read and written by said control module (4). In a preferred execution of the invention, said non-volatile memory is an EEPROM memory. Nevertheless, other types of non-volatile memories may be used without this limiting the scope of the present invention, such as, without limiting to these, Flash memories, hard disk drives, solid state drives, among others.

According to the invention, said information recording module (6) allows, for example, to record the date, time, phase and circuit of the anomalies detected. This registration information may be consulted thanks to the remote communication module (5) of the protection device (1) which is subject of the present invention. Said enquiries, for example, may allow to reduce time used in the clarification of faults and in the necessary adjustments for the balancing of the charge.

On the other side, the visual alert module (7) of the protection device (1) which is subject of the present invention comprises visual means to indicate the protection device (1) state which is subject of the present invention. Said visual alert module (7) and specifically said visual means, are controlled by the control module (4). Said visual means may comprise indicator lights or a digital display, as well as other indicators means of the protection device (1) state which is subject of the present invention, without this limiting the scope thereof.

In a preferred execution, said visual means of the visual alert module (7) comprise indicator lights of different colors, for example, three lights. Different meanings for different colors may be established from said indicator lights without this limiting the scope of the present invention, which is commonly known as colors code. In a more preferred execution of the invention, without this limiting the scope thereof, the color code is set as follows: red light, danger sign, voltage presence, it is not possible to operate the device; yellow light, warning sign, the device is in standby, it is required to wait before handling the device since there are current signs; and green light, voltage absence sign, operations can be carried out without risk.

In a preferred execution of the invention, without this limiting the scope thereof, the current monitoring that is carried out in the fault detection module (3) may be done through hall effect current transformers and voltage monitoring, also carried out in the fault detection module (3), with voltage comparators, which measure the current and voltage, substantially, at all times. Said measurements may be done at any time interval without this limiting the scope of the present invention. Nevertheless, due to a continuous monitoring of the transformer is sought, said measurements may be done, for example, every one minute in each line (9 lines in the case of FIG. 2). This information is stored in the non-volatile memory, for example EEPROM, of the information recording module (6) to be consulted at the user's Will. Additionally, and routinely, the device will send a report with the information stored during a given period of time, preferably, without this limiting the scope of the present invention, every 24 hours, by means of the remote communication module (5). The above mentioned aims to be able to establish the curves of the charge of every transformer (phases, circuits and lines), for example and without this limiting the scope of the present invention.

The control module (4) compares, in certain time intervals, for example every one minute, current signals received by each line and if a percentage difference between phases is found and if it is greater than the established percentage, preferably between 20% and 50%, it will send an alarm message through a remote communication module (5) in order to the manager makes the decision to intervene or not the transformer.

As previously mentioned, the remote-control operation of the protection device (1), either on or off, as well as other operation conditions, may be done, for example and without this limiting the scope of the invention, through the remote communication module (5), from the plant through any protocol and appropriate communication system, such as IoT, radio or any other. In addition, and without this limiting the scope of the invention, may be done at the place, also through the remote communication module (5), through a communication system via Bluetooth or any other remote communication system of short range that allows to do it.

In a preferred execution of the invention, as shown in FIG. 2, the protection device (1) receives charge from lines 1-9, which are controlled by the contactor (A1) and the current limiters (L1-L9). In case of an overcurrent event in any of the lines, the corresponding current limiter (L1-L9) opens, causing that the controller of the control module (4) detects a fault and opens all the phases of the circuit, disconnecting the contactor (A1).

On the other hand, in another preferred execution of the invention, the protection device (1) of the present invention compares, by means of a comparator present in the control module (4), the voltage measured in the voltage sensors of each phase with respect to an established voltage threshold, generating an output voltage as function of said comparison. In a preferred execution of the invention, the output voltage of the comparator is between 4.5 V and 6.0 V when the limiters are closed. In a preferred manner, the output voltage of the comparator is of 5 V, which allows its acquisition and reading by the controller of the control module (4).

According to this execution of the invention, the controller of the control module (4) acquires the outputs of the comparators and generates signals to control the contactor (A1). When an overcurrent is detected the corresponding limiter opens, causing that the output voltage drops to 0 V and producing that the controller of the control module (4) detects a fault and opens all the phases of the circuit, disconnecting the contactor (A1). After a waiting time, the controller of the control module (4) activates the contactor (A) to supply the charge. In a preferred execution of the invention, the waiting time is between 10 and 40 seconds, more preferably between 20 and 30 seconds.

In the event in which the fault persists after three reconnection attempts, the protection device (1) which is subject of the present invention increases the fault count and totally disables the power supply. In a preferred execution of the invention, the fault count restarts after a second waiting time or when restarting the module manually by the remote control, as previously explained, after being in the STOP state. This time allows the thermal fuse to cool down. In an execution of the invention, the second waiting time is between 10 and 40 seconds, more preferably between 20 and 30 seconds.

In another execution of the present invention, without this limiting the scope thereof, the protection device (1) of the present invention compares the voltage measured in the sensors of each phase regarding an established voltage threshold, by means of a comparator present in the control module (4), generating an output voltage in the comparator. In a preferred execution of the invention the output voltage of the comparator is between 110 V and 130 V, preferably 120 V.

When an overvoltage is detected, an alarm is generated, causing that the controller of the control module (4) detects a fault and opens all phases of the circuit, disconnecting the contactor (A1). In an execution of the invention the waiting time for the reconnection is between 10 and 40 seconds, preferably between 20 and 30 seconds.

The comparator of the control module (4) can compare the voltage signals received by each of the lines at regular intervals, for example and without this limiting the scope of the invention, every one minute and if it finds a percentage difference between phases greater than an established percentage, preferably between 20% and 50%, it will send an alarm message in order to the manager makes the decision to intervene or not the transformer.

As a consequence of these technical characteristics, the protection device (1) of the invention allows to reconnect the charge when a temporary fault occurs such as the contact of a tree branch with a conductive or a charge imbalance, without requiring the intervention of a worker.

Advantageously, the protection device (1), according to the present invention, can monitor from 1 to 9 individual lines, hence is suitable for protecting and controlling from a twin-lead single-phase charge to a three-phase charge.

Likewise, the protection device (1) according to the present invention, allows the detection of absence of neutral in the module when recognizing the imbalance of phase currents that occurs when the neutral current is zero.

The protection device (1) according to the present invention may work at any transformer output voltage without this limiting the scope of the present invention. In a preferred execution the operating voltage of the invention device is 120 V to 240 V.

Although reference is made to a preferred execution, it is understood that this is illustrative, and it does not limit the scope of the invention and the variations of this execution are also included within the development carried out.

The invention claimed is:

1. A monitoring and protection device of power distribution transformers on the low voltage side, characterized in that it comprises:
    a power module that is connected to the secondary busbar of the transformer, which comprises a load-disconnector and it is controlled by a control module, said power module comprising a contractor having a multi-voltage tripping coil;
    a fault detection module, next to said power module comprising a diversity of overcurrent sensors and a diversity of voltage sensors, configured to communicate the measurements obtained by said overcurrent sensors and voltage sensors to respective current comparators and voltage comparators of a control module;
    the control module comprising a controller, a current comparator and two voltage comparators, said control module configured to control said power module, to receive said measurements from said fault detection module, to read and write a non-volatile memory of an information recording module, to communicate in a bidirectional way with a remote communication module and to control a visual alert module;
    the remote communication module, configured to communicate bidirectionally with said control module, said remote communication module additionally comprising a radio frequency transceiver configured for a short range wireless communication;
    the information recording module which comprises a non-volatile memory configured to be read and written by said control module; and
    the visual alert module that is controlled by said control module;

wherein said control module comprises, also, a processor that executes an algorithm which allows to determine the presence of a fault and that delays the entrance of a charge during a reconnection, said delay in the entrance of the charge being carried out in a time that is chosen randomly in the range between 0 s and 30 s;

wherein a sub-range of the delay time within the range between 0 s and 30 s of the delay time of the charge during the reconnection is selectable through two switches;

wherein said radio frequency transceiver configured for a short range wireless communication allows interruption and reconnection of the protection device; and wherein for determining the presence of a fault, said control module executes the following tasks:

to compare the voltage measured by said voltage sensors of each phase regarding a threshold or the current measured by said overcurrent sensors concerning the threshold value;

to generate output voltages as a function of said comparison; and to control the load-disconnector according to said output voltages.

2. The device of claim 1, characterized in that said fault detection module comprises a plurality of overcurrent sensors and a plurality of voltage sensors, and in that said fault detection module is configured to communicate the measurements obtained by each of the overcurrent sensors of the plurality and from each of said voltage sensors of the plurality to said control module.

3. The device of claim 1, characterized in that said overcurrent sensors are selected from the group that comprises bimetallic thermal fuses and current transformers.

4. The device of claim 1, characterized in that said radio frequency transceiver is configured for a short range wireless communication by a communication protocol that is Bluetooth.

5. The device of claim 1, characterized in that said remote communication module additionally comprises a second radio frequency transceiver configured for a long range wireless communication.

6. The device of claim 1, characterized in that said non-volatile memory from said information recording module is an EEPROM memory.

7. The device of claim 1, characterized in that the visual alert module comprises indicator lights.

* * * * *